United States Patent [19]

Tanaka

[11] Patent Number: 5,729,337
[45] Date of Patent: Mar. 17, 1998

[54] INCLINATION DETECTING APPARATUS

[75] Inventor: Yasuaki Tanaka, Chigasaki, Japan

[73] Assignee: Nikon Corporation, Tokyo, Japan

[21] Appl. No.: 555,176

[22] Filed: Nov. 8, 1995

[30] Foreign Application Priority Data

Nov. 28, 1994 [JP] Japan ................................ 6-292656

[51] Int. Cl.$^6$ .................................................. G01C 3/06
[52] U.S. Cl. ........................ 356/139.1; 356/152.2; 356/375; 356/400
[58] Field of Search ........................ 356/139.07, 139.1, 356/3.08, 152.2, 375, 400; 250/559.38, 559.37

[56] References Cited

U.S. PATENT DOCUMENTS

| | | | |
|---|---|---|---|
| 4,558,949 | 12/1985 | Uehara et al. | 356/152 |
| 4,709,156 | 11/1987 | Murphy et al. | 250/560 |
| 5,473,166 | 12/1995 | Imai et al. | 250/548 |
| 5,510,892 | 4/1996 | Mizutani et al. | 356/139.1 |
| 5,602,399 | 2/1997 | Mizutani | 250/548 |
| 5,602,400 | 2/1997 | Kawashima | 250/548 |

*Primary Examiner*—Mark Hellner
*Attorney, Agent, or Firm*—Shapiro and Shapiro

[57] ABSTRACT

An inclination detecting apparatus has an irradiating optical system for illuminating a substrate to be measured with parallel light flux diagonally, a condensing optical system for condensing the parallel light flux reflected by the substrate, a photoelectric detecting device for generating detection signals corresponding to a position of the parallel light flux condensed by the condensing optical system, a relative scanning device for scanning the parallel light flux emitted from the irradiating optical system to the substrate and the substrate relatively and a calculating circuit for obtaining information corresponding to an inclination of an average plane of a surface of the substrate by performing a statistical processing for the detection signals taken from the photoelectric detecting device in accordance with a relative scanning position of the parallel light flux and the substrate.

11 Claims, 3 Drawing Sheets

1

INCLINATION DETECTING APPARATUS

BACKGROUND OF THE INVENTION

1. Field of the Invention

The present invention relates to an inclination detecting apparatus for detecting the inclination of the surface of a substrate such as a semiconductor wafer with respect to a predetermined reference surface, and more particularly to an inclination detecting apparatus which is applied effectively to a leveling sensor for detecting the inclination of the surface of a photosensitive substrate with respect to the image surface of a projection optical system in a projection exposure apparatus to be used for projecting a mask pattern to the photosensitive substrate at the time of manufacturing, e.g., semiconductors devices and, liquid crystal display devices.

2. Related Background Art

In a projection exposure apparatus, in order to project a pattern of a reticle as a mask via a projection optical system to each shot area on a photosensitive substrate such as a wafer or glass plate with a photosensitive material applied thereto at high resolution, it is necessary to make the surface of each shot area approximately coincide with the image surface of the projection optical system within the range of focal depth. Therefore, the projection exposure apparatus is provided with an autoleveling mechanism for setting an average plane of each shot area on the photosensitive substrate in parallel with the image surface, and an autofocus mechanism for setting the height of a predetermined point in each shot area to the height of the image surface. The autoleveling mechanism is constructed by a leveling sensor for detecting the inclination of the average plane of a shot area of the photosensitive substrate to be exposed (or an area which can be approximately taken as the shot area) with respect to the image surface, and a leveling stage for supporting the shot area such that the inclination of the average plane thereof becomes zero.

The conventional leveling sensor (detecting system of the inclination) is constituted of an irradiating optical system for making monochromatic light emitted from a pinhole into parallel light flux and diagonally irradiating a shot area on the photosensitive substrate or a portion of the shot area, a condensing optical system for condensing light flux reflected by the photosensitive substrate to form a pinhole image, and a four-division light receiving device for generating detection signals in accordance with the imaging position of the pinhole image. In this case, when the inclination of the shot area is varied, the imaging position (light condensed position) on the four-division light receiving device is varied and accordingly, the detection signals are varied. Therefore, the inclination of the photosensitive substrate is controlled such that the detection signals are maintained in a predetermined state.

In the above-mentioned prior art, the monochromatic parallel light flux irradiates approximately the whole surface of the comparatively large shot area on the photosensitive substrate to be exposed. However, when a periodic pattern is formed on each shot area on the photosensitive substrate after various forming processes, and when the comparatively large shot area is irradiated with monochromatic parallel light, diffracted light might be produced by the patterns. The diffraction angle depends on the pattern pitch. Therefore, as the pattern pitch becomes large to a certain extent, the diffraction angle becomes small to cause the diffracted light to enter the four-division light receiving device.

When this occurs, owing to the inclination of the optical axis of the irradiating optical system with respect to the photosensitive substrate and the dissymmetry of the shapes of the pattern on the photosensitive substrate and a photosensitive material (photoresist) applied onto the photosensitive substrate, a difference in light quantity between +order diffracted light and −order diffracted light may occur. In that case, detection signals of the four-division light receiving device are changed by the unbalance of the light quantity, to produce an error included in the detection result of the inclination, which is fundamentally determined by the zero-order light. Thereby, the photosensitive substrate will not be appropriately disposed in parallel with the image surface.

Also, in order to reduce interference in a thin film such as a photoresist, it is well known to utilize, rather than utilizing monochromatic light, utilize light flux distributed in a wavelength range (zone) with a predetermined width as the light for the inclination detection. However, even though such light flux having the predetermined wavelength width is utilized, when a periodic patterns is formed on the photosensitive substrate, a state may occur where the light quantity distribution on the four-division light receiving device is such that diffracted light for each wavelength in the zone is superimposed. Therefore, the inclination detection is improperly influenced by the unbalance of the diffracted light similarly the case of utilizing the monochromatic light.

SUMMARY OF THE INVENTION

In view of the above problems, it is an object of the present invention to provide an inclination detection apparatus capable of detecting the inclination of the surface of a substrate, such as a photosensitive substrate, accurately, even though periodic patterns are formed on the surface of the substrate.

An inclination detecting apparatus according to the present invention has, e.g., as shown in FIG. 1, an irradiating optical system 8 for obliquely illuminating a substrate 4 to be measured with parallel light flux; a condensing optical system 21 for condensing the parallel light flux reflected by the substrate 4; a photoelectric detecting device 22 for generating detection signals corresponding to the position of the parallel light flux condensed by the condensing optical system 21; a relative scanning device 16, 17 for scanning the parallel light flux emitted from the irradiating optical system 8 to the substrate 4 relative to the substrate 4 one-dimensionally or two-dimensionally; and a calculating circuit 19 for obtaining information corresponding to the inclination of the average plane of a surface of the substrate 4 by performing a statistical processing (averaging, integration, etc.) for the detection signals taken from the photoelectric detecting device in accordance with the relative scanning position of the parallel light flux and the substrate 4.

In this case, when the irradiating optical system 8 is formed by a relay optical system 11, 13 for condensing light flux from a predetermined pattern 10; and an irradiating objective optical system 14 for transforming the condensed light flux into the parallel light flux, as the relative scanning device, it is possible to utilize a scanning device having a reflecting member 16 disposed on a condensed point of the light flux condensed by the relay optical system 11, 13; and a drive device 17 for driving the reflecting member 16 to change the incident angle of the light flux condensed by the relay optical system 11, 13 with respect to the irradiating objective optical system 14.

Also, when the parallel light flux and the substrate 4 are scanned one-dimensionally, it is desirable to scan the parallel light flux from the irradiating optical system 8 to the substrate 4 relative to the substrate 4, by means of the relative scanning device, 16, 17 along the incident direction (X direction) of the parallel light.

Further, it is desirable to provide a stop 26 for restricting an inclination detection area on the substrate 4 in the irradiating optical system 8 or the condensing optical system 21.

According to the present invention, for example, as shown in FIG. 2A, when detecting a predetermined shot area 28 on the substrate 4, parallel light flux is directed obliquely to a rectangular illumination area 27A which is narrower in the X direction than the shot area 28. In this case, even though periodic patterns are formed on the substrate 4 in the X direction at a predetermined pitch, as the illumination area 27A is narrow in the X direction, the possibility that there are patterns for a plurality of cycles in the illumination area 27A is low, and the intensity of diffracted light is weak even if there are patterns for a plurality of cycles therein. Therefore, improper influence due to unbalance between +order diffracted light and −order diffracted light can be reduced. Accordingly, it is possible to obtain the information corresponding to the accurate inclination of the average plane of the narrow illumination area 27A from the detection signals of the photoelectric detecting device 22.

Also, it is possible to obtain information corresponding to the accurate inclination of the average plane of the whole shot area 28 by scanning the illumination area 27A and the substrate 4 relatively in the X direction and, e.g., integrating detection signals from the photoelectric detecting device 22.

In this case, when the parallel light flux and the substrate 4 are scanned relatively, the position of the condensed point of the parallel light flux on the photoelectric detecting device 22 is varied as the incident angle of the parallel light flux is varied. Therefore, it is necessary to obtain the relationship between the relative scanning position and the condensed point on the photoelectric detecting device 22 in advance, and to correct the detection signals from the photoelectric detecting device 22 in accordance with the relative scanning position.

On the contrary, the incident angle of the parallel light flux may be set so as not to be varied when scanning the parallel light flux and the substrate. 4 relatively. Thereby, since the position of the condensed point on the photoelectric detecting device 22 will not be varied at the time of the relative scanning, processing of the detection signals is simplified. As the method of not varying the incident angle of the parallel light flux, for example, the substrate 4 is moved along a predetermined plane with respect to the parallel light flux.

Alternatively, in order to move the incident position of the parallel light flux on the surface of the substrate 4 without varying the incident angle of the parallel light flux, the reflecting member 16 is disposed on the front focal point position of the irradiating objective optical system 14. In this case, the light flux from the predetermined pattern (a pinhole, etc.) is condensed by the relay optical system 11, 13 on the reflecting member 16 (the image of the predetermined pattern is formed). The reflected light from the reflecting member 16 is incident on the irradiating objective optical system 14. When varying the angle of the reflecting member 16 by means of the drive device 17, the parallel light flux emitted from the irradiating objective optical system 14 is shifted, so that the illumination position of the parallel light flux is varied with its incident angle with respect to the substrate 4 remaining constant.

Next, as shown in FIG. 2B, if the incident direction of the parallel light flux 15 with respect to the substrate 4 is primarily in the X direction and the normal direction to the surface of substrate 4 is the Z direction, and when periodic patterns are formed on the substrate 4 in the X direction, for example, ±first-order diffracted light 29A, 29B is produced in an XZ plane so as to interpose the reflected light (zero-order light) 20 from the substrate 4. In this case, as the parallel light flux 15 is propagated obliquely the direction, the quantity of +first-order diffracted light and that of −first-order diffracted light are liable to be unbalanced owing to the dissymmetry. Therefore, in order to reduce influence of the unbalance, the width of the illumination area 27A in the X direction is narrowed, and the relative scanning direction is determined to be the X direction.

At this time, even though periodic patterns are formed in the Y direction perpendicular and into the paper of FIG. 2B, the parallel light flux 15 is incident on the patterns symmetrically, so that the quantity of +first-order diffracted light 29A is approximately equivalent to that of −first-order diffracted light 29B. Therefore, no improper influence will occur due to the diffracted light. Accordingly, even if the illumination area 27A is elongated in the Y direction, the detection accuracy of the inclination will not be deteriorated.

Next, as shown in FIG. 1, when the stop 26 is provided in the irradiating optical system 8 or the condensing optical system 21, the inclination detection area on the substrate 4 can be limited to a desired size without depending on the scanning range of the parallel light flux 15.

DESCRIPTION OF THE PREFERRED EMBODIMENTS

An embodiment of an inclination detecting apparatus according to the present invention will be described hereinafter with reference to the accompanying drawings. In this embodiment, the present invention is applied to a leveling sensor provided in a projection exposure apparatus.

Figure 1:
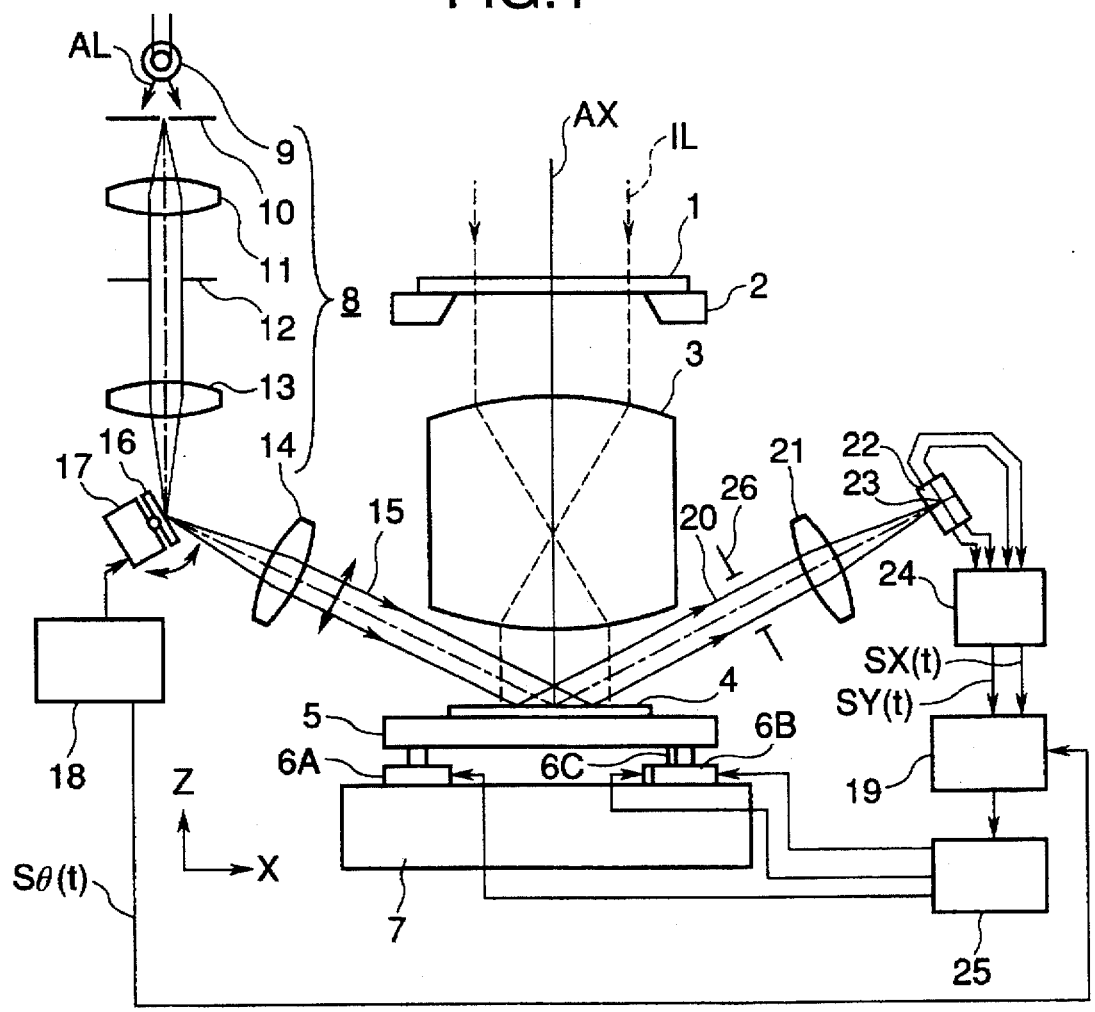
FIG. 1 shows an essential portion of a projection exposure apparatus using an inclination detecting apparatus according to an embodiment of the present invention.

FIG. 1 shows an essential portion of the projection exposure apparatus of this embodiment. In FIG. 1, a reticle 1 is supported on a reticle stage 2. At the time of exposure, the reticle 1 is illuminated with exposure light IL from an illumination optical system (not shown) disposed in an upper portion of the projection exposure apparatus. Then, under the light IL, the image of the pattern of the reticle 1 is projected and formed via a projection optical system 3 on each shot area of a wafer 4, which is coated with photoresist as a photosensitive substrate. A Z-axis is plotted in parallel with an optical axis AX of the projection optical system 3, an X-axis is plotted within a plane perpendicular to the Z-axis in parallel with the paper of FIG. 1, and a Y-axis is plotted perpendicularly to the paper of FIG. 1.

The wafer 4 is supported on a leveling stage 5, which is disposed on a wafer stage 7 via three up-and-down moving mechanisms 6A to 6C. The up-and-down moving mechanisms 6A to 6C can be expanded and contracted in the Z direction and may be each a mechanism for converting the rotation angle of a drive motor into displacement in the Z direction by means of a decentered cam or a mechanism for rotating a feed screw disposed in the Z direction by means of a drive motor or a piezo-electric element. It is possible to adjust the inclination of the surface (the surface to be detected) of the wafer 4 around the X-axis and the inclination thereof around the Y-axis by adjusting the amount of expansion and contraction of each of the up-and-down moving mechanisms 6A to 6C separately. Further, it is possible to adjust the position of the wafer 4 in the Z direction (focal point position) within a predetermined range by expanding and contracting the up-and-down moving mechanisms 6A to 6C in the Z direction in parallel with each other by the same amount.

Also, the wafer stage 7 is constituted of a Z stage for positioning the wafer 4 roughly in the Z direction, an XY stage for positioning the wafer 4 in an XY plane and the like. At the time of exposure operations, each shot area of the wafer 4 is shifted sequentially in the exposure field of the projection optical system 3 via the wafer stage 7 in a step-and-repeat method and subjected to autofocus and autoleveling operations, thereby the pattern image of the reticle 1 can be exposed on each shot area.

The leveling sensor of this embodiment is constructed of an irradiating optical system 8, an oscillation mirror 16, a condenser lens 21 as a condensing optical system and a four-division light receiving device 22. First, in the irradiating optical system 8, light AL emitted from a light source 9 such as a halogen lamp illuminates a pattern plate 10. The light AL is in a wavelength range that has a poor photosensitivity with respect to the photoresist layer on the wafer 4. The light AL passed through a pinhole of the pattern plate 10 illuminates a field stop 12 with a slit-like opening via a first relay lens 11. The longitudinal direction of the slit-like opening is the Y direction (the direction perpendicular and into the paper of FIG. 1). The light AL emanated from the opening of the field stop 12 is condensed by a second relay lens 13.

On the condensed point, i.e., a position conjugate to the pinhole of the pattern plate 10, is disposed the oscillation mirror 16, which is swung by an exciter 17 around an axis parallel to the Y direction. As the oscillation mirror 16 and the exciter 17, a galvanomirror or a polygon mirror to be rotated by a motor can be utilized. Also, the oscillating operation of the exciter 17 is controlled by an oscillation control system 18. An angle signal Sθ(t) corresponding to the inclination of the oscillation mirror 16 is supplied from the oscillation control system 18 to an averaging circuit 19.

An objective lens 14 is disposed with the condensed point on the oscillation mirror 16 as a front focal point. Further, the optical axis of the objective lens 14 intersects the optical axis AX of the projection optical system 3 obliquely. The light AL reflected by the oscillation mirror 16 is transformed into parallel light flux 15 via the objective lens 14 incident on the surface (the surface to be detected) of the wafer 4 obliquely. When the oscillation mirror 16 is swung, the parallel light flux 15 emitted from the objective lens 14 is translated in the perpendicular direction to the optical axis of the objective lens 14 and scans the surface of the wafer 4 in the ±X direction.

Zero-order light 20 reflected by the surface of the wafer 4 owing to the incidence of the parallel light flux 15 is condensed by the condenser lens 21 on the light receiving surface of the four-division light receiving device 22, whereby an image 23 of the pinhole of the pattern plate 10 is formed on the light receiving surface. That is, the light receiving surface of the four-division light receiving device 22 is conjugate to the reflecting surface of the oscillation mirror 16 and the surface of the pattern plate 10. The position of the pinhole image 23 is varied in accordance with the inclination of the surface of the wafer 4.

Figure 3:
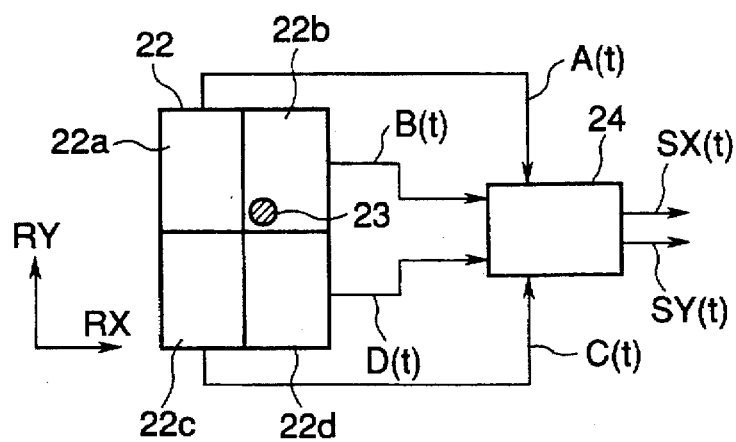
FIG. 3 is a front view showing the four-division light receiving device 22 of FIG. 1.

FIG. 3 shows a front view of the four-division light receiving device 22. As shown in FIG. 3, the four-division light receiving device 22 is divided into four light receiving devices 22a to 22d such as photodiodes which are independent of each other and have respective rectangular light receiving surfaces arranged closely. The light incident on the light receiving devices 22a, 22b, 22c, 22d is photoelectrically converted into respective detection signals A(t), B(t), C(t), D(t). These detection signals A(t) to D(t) are expressed by functions of time t. The detection signals A(t) to D(t) are supplied to a calculating circuit 24.

In FIG. 3, if the direction corresponding to the width direction to the paper of FIG. 1 is an RX direction and the direction perpendicular to the RX direction is an RY direction, the light receiving devices 22a to 22d are arranged so as to form two columns in the RY direction and two rows in the RX direction. The calculating circuit 24 calculates a detection signal SX(t) corresponding to the position of the pinhole image 23 on the four-division light receiving device 22 in the RX direction and a detection signal SY(t) corresponding to the position thereof in the RY direction from the following equations:

$$SX(t)=[\{A(t)+C(t)\}-\{B(t)+D(t)\}]/E. \quad \text{(Equation 1)}$$

$$SY(t)=[\{A(t)+B(t)\}-\{C(t)+D(t)\}]/E. \quad \text{(Equation 2)}$$

Here, E of the denominator is the sum of the respective detection signals.

$$E=A(t)+B(t)+C(t)+D(t). \quad \text{(Equation 3)}$$

In this case, actually, the detection signals A(t) to D(t) are signals obtained by amplifying the output signals from the light receiving devices 22a to 22d by means of amplifiers (not shown). The amplification degrees of the amplifiers are adjusted such that when the same quantity of light flux is incident on each of the light receiving devices 22a to 22d, the detection signals A(t) to D(t) becomes the same in magnitude. Also, the position of the four-division light receiving device 22 is adjusted such that when a reference member whose surface has preferable flatness is disposed in the exposure field of the projection optical system and the flat surface thereof coincides with the image surface, the pinhole image is formed on the center of the four-division light receiving device 22 and the detection signals SX(t) and SY(t) each become zero.

Therefore, when the surface of a shot area on the wafer 4 to be exposed is flat and coincides with the image surface, the position of the pinhole image 23 is on the center of the four-division light receiving device 22. However, when the surface of the shot area is inclined around the axis parallel to the X-axis, the position of the pinhole image 23 is displaced approximately in the RX direction to cause the value of the detection signal SX(t) to be changed. On the other hand, when the surface of the shot area is inclined around the axis (the axis perpendicular to the paper of FIG. 1) parallel to the Y-axis, the position of the pinhole image 23 is displaced approximately in the RY direction to cause the value of the detection signal SY(t) to be changed. Therefore, it is possible to set the surface of the shot area in parallel with the image surface by adjusting the inclination $\theta_x$ of the leveling stage 5 around the axis parallel to the X-axis and the inclination $\theta_y$ thereof around the axis parallel to the Y-axis such that the values of the detection signals SX(t) and SY(t) each become zero.

However, actually, since an irregular pattern is formed on each shot area of the wafer 4, diffracted light other than the zero-order light 20 is produced from the surface of the wafer 4 and the diffracted light might influence the detection signals SX(t) and SY(t). Then, in order to reduce the influence of the diffracted light, the width of an illumination area on the wafer 4 illuminated with the parallel light flux 15 from the irradiating optical system 8 is made narrower in the X direction than that of the shot area, and the parallel light flux 15 is scanned in the ±X direction.

For averaging the detection signals SX(t) and SY(t) in the scanning direction, in FIG. 1, the detection signals SX(t) and SY(t) from the calculating circuit 24 are supplied to the averaging circuit 19. The angle signal S$\theta$(t) corresponding to the inclination of the oscillation mirror 16 is also supplied from the oscillation control circuit 18 to the averaging circuit 19. Further, the angular velocity of the swing of the oscillation mirror 16 is constant and the scanning speed of the parallel light flux 15 on the wafer 4 in the ±X direction is constant. In this case, during a period T in which the value of the angle signal S$\theta$(t) is within a predetermined range, i.e., the period T in which the parallel light flux 15 is scanning a shot area on the wafer 4 to be exposed, the averaging circuit 19 integrates the detection signals SX(t) and SY(t) to obtain integration signals <SX(t)> and <SY(t)>. It is to be noted that an integration Symbol ∫dt means the integration with respect to the time t within the period T.

$$<SX(t)>=\int SX(t)dt,$$

$$<SY(t)>=\int SY(t)dt \qquad \text{(Equation 4)}$$

The calculation of the Equation 4 may be carried out by the analog calculation. Alternatively, after the detection signals SX(t) and SY(t) are sampled and held in predetermined sampling cycles within the period T, and converted from analog into digital form, the obtained data may be digitally integrated.

However, when the angular velocity of the oscillation mirror 16 is not constant, after the detection signals SX(t) and SY(t) are sampled and held each time the inclination (the angle signal S$\theta$(t)) of the oscillation mirror 16 is changed and the amount of movement of the parallel light flux 15 in the X direction reaches a predetermined amount, the obtained data may be converted from analog into digital form and integrated.

Further, after the detection signals A(t) to D(t) from the four-division light receiving device 22 are converted from analog into digital form in small sampling cycles, the above calculation of the Equations 1 and 2 and the averaging calculation may be carried out wholly by the digital calculation.

The integration signals <SX(t)> and <SY(t)> are supplied to a stage control system 25. The stage control system 25 adjusts the amount of expansion and contraction of each of the up-and-down moving mechanisms 6A to 6C such that the integration signals <SX(t)> and <SY(t)> each become zero. Thereby, the average plane of the surface of the shot area on the wafer 4 is set in parallel with the image surface. Also, based on a position (focal point position) in the Z direction measured by a focal point position detecting system (not shown), after the focal point position at the center of the shot area is set to the focal point position of the image surface, the pattern of the reticle 1 are projected and exposed on the shot area.

Instead of integrating the detection signals SX(t) and SY(t) (in the case of digital data, addition), signals obtained by averaging the detection signals SX(t) and SY(t) taken at predetermined time intervals may be utilized.

Next, the operation of the leveling sensor in this embodiment will be described in detail with reference to FIGS. 2A and 2B.

Figure 2A:
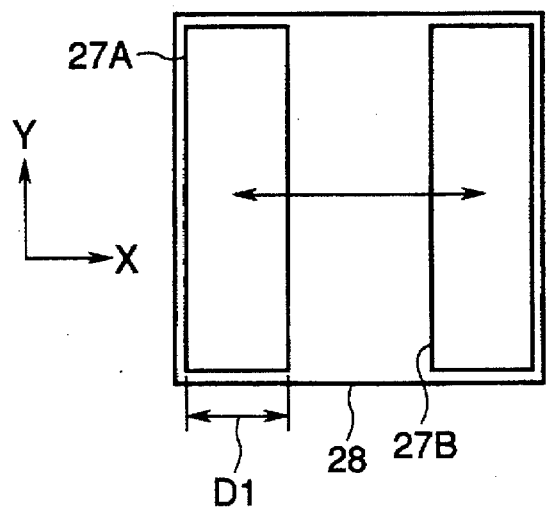
FIGS. 2A and 2B show the relationship between the inclination of the oscillation mirror 16 and the moving direction of the illumination area of parallel light flux in the embodiment.
Figure 2B:
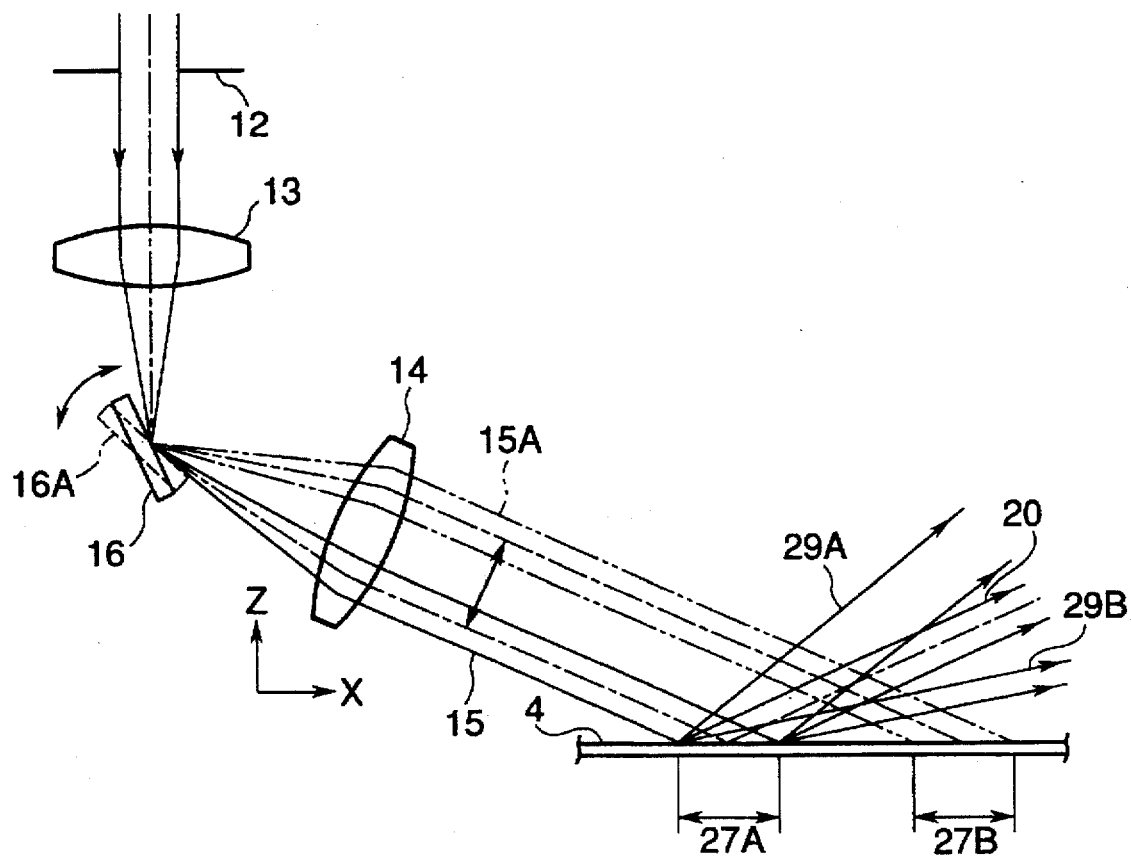

FIG. 2B shows an essential portion of the irradiating optical system 8 of FIG. 1 and the oscillation mirror 16, wherein at a time point $t_1$, the inclination of the oscillation mirror 16 is $\theta_1$. At this time, light passed through the field stop 12 is incident via the oscillation mirror 16 and the objective lens 14 on an area 27A of the surface of the wafer 4 as the parallel light flux 15. The zero-order light 20 reflected by the area 27A forms the pinhole image 23 on the four-division light receiving device 22 via the condenser lens 21 of FIG. 1. Then, detection signals SX($t_1$) and SY($t_1$) corresponding to the position of the pinhole image 23, i.e., the inclination of the average plane of the area 27A are output from the calculating circuit 24.

Thereafter, as shown in FIG. 2B, when the oscillation mirror 16 is inclined to be in a position 16A at a time point $t_2$ and the inclination thereof is changed to $\theta_2$, the parallel light flux 15 emanated from the objective lens 14 is translated into a position 15A and incident on an area 27B on the wafer 4. Zero-order light reflected from the area 27B forms a pinhole image on the four-division light receiving device 22 of FIG. 1, and detection signals SX(t) and SY(t) in accordance with the inclination of the average plane of the area 27B are output from the calculating circuit 24.

Also, FIG. 2A shows a plan view of the wafer 4 of FIG. 2B. In FIG. 2A, the areas 27A and 27B are located at end portions of a shot area 28 on the wafer 4 to be exposed. This means that the parallel light flux 15 scans the shot area 28 one time in the X direction while the oscillation mirror 16 is inclined from the time point $t_1$ to the time point $t_2$. Therefore, by integrating the detection signals SX(t) and SY(t) of FIG. 1 for a cycle from the time point $t_1$ to the time point $t_2$ in synchronism with the variation of the inclination of the oscillation mirror 16, it is possible to detect the inclination of the average plane of the whole shot area 28 on the wafer 4.

Further, in order to obtain averaging effect in time, the detection signals SX(t) and SY(t) may be averaged for a plurality of cycles of the swing of the oscillation mirror 16, i.e., a period in which the parallel light flux 15 scans the shot area 28 on the wafer 4 a plurality of times. Thereby, it is possible to obtain the inclination of the average plane of the shot area 28 with high precision by reducing influence such as of variations in air condition, fluctuations of the swing of the oscillation mirror 16 and electric noise.

Next, the method of determining the width D1 of the illumination area 27A of the parallel light flux 15 in the scanning direction (X direction) will be described with reference to FIGS. 2A and 2B. First, as shown in FIG. 2A, the illumination area 27A of the parallel light flux 15 on the wafer 4 is a rectangular area whose width in the Y direction is the same as that of the shot area 28. For example, the shot area 28 is a square area having sides of about 20 mm which touches the exposure field having a diameter of about 28 mm, so the width of the illumination area 27A in the Y direction is about 20 mm.

In this case, when periodic irregular patterns are formed on the shot area 28 in predetermined pitch in the X direction of the incident direction of the parallel light flux 15 under the previous processes, and as shown in FIG. 2B, the pattern pitch is smaller than the width D1 of the illumination area 27A on the wafer 4 illuminated with the parallel light flux 15 in the X direction, diffracted light such as +first-order diffracted light 29A and −first-order diffracted light 29B is emitted from the illumination area 27A in the XZ plane, in addition to the zero-order light 20. Since the parallel light flux 15 is incident on the irregular patterns on the wafer obliquely and dissymmetrically, the balance of the light quantity between the +first-order diffracted light 29A and the −first-order diffracted light 29B is easily disturbed. Therefore, when the +first-order diffracted light 29A and the −first-order diffracted light 29B are incident on the four-division light receiving device 22 of FIG. 1, the light quantity distribution is deviated from the proper position, causing the measurement of the average inclination of the area 27A to be detected erroneously. In order to avoid that, it is preferable to set the width D1 of the illumination area 27A of the parallel light flux 15 in the X direction smaller than the pitch of the periodic patterns on the wafer 4 in the X direction. Further, even though the patterns for about two cycles are contained in the illumination area 27A, since the intensity of the diffracted light is weak, it is sufficient to set the width D1 smaller than twice the pitch of the patterns on the wafer 4. Usually, the problem of diffracted light arises in the case of patterns with the pitch of about 1 mm. Therefore, it is desirable to set the width D1 of the illumination area 27A in the X direction smaller than 2 mm. Further, when the width D1 is smaller than 1 mm, diffracted light is reduced and the inclination of the illumination area 27A can be detected with high accuracy.

At this time, even though periodic irregular patterns are formed within the illumination area 27A in the Y direction perpendicular to the incident direction of the parallel light flux 15, the quantity of +first-order diffracted light from the patterns is approximately equal to that of −first-order diffracted light therefrom as the parallel light flux 15 is incident on the patterns symmetrically. Therefore, even though the diffracted light is produced from the periodic patterns in the Y direction, it is canceled on the four-division light receiving device 22, so that the detection accuracy of the inclination of the illumination area 27A will not be deteriorated. Accordingly, the illumination area 27A may be elongated in the Y direction, and it is sufficient to scan the parallel light flux 15 in the X direction one-dimensionally.

Next, as shown in FIG. 1, in this embodiment, the field stop 26 is disposed between the wafer 4 and the condenser lens 21. The width of the opening of the field stop 26 in FIG. 1 is set fairly larger than the width of the zero-order light 20. On the other hand, the width of the field stop 12 disposed between the oscillation mirror 16 and the light source 9 is narrow, and the widths or the light flux 15 on the wafer 4 in the X and Y directions are determined by the field stop 12.

Figure 4:
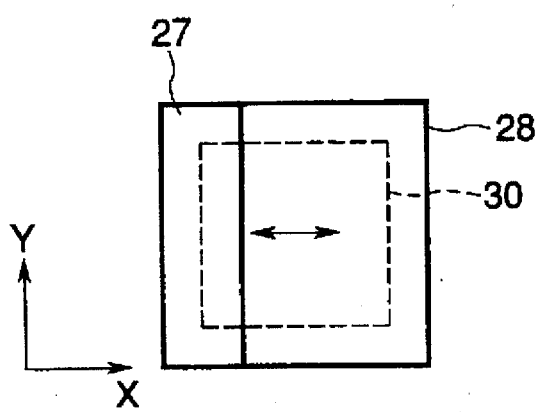
FIG. 4 is a plan view showing the relationship between an illumination area 27 of the parallel light flux in the embodiment and a detection area 30 restricted by the field stop of FIG. 1.

Referring to FIG. 4 showing a plan view of the shot area 28 on the wafer 4, the difference between the field stop 12 and the field stop 26 will be described. In FIG. 4, within the shot area 28, the rectangular illumination area 27 whose width in the Y direction is equal to the width of the shot area 28 in the Y direction is the area restricted by the field stop 12. The illumination area 27 scans the shot area 28 by the swing of the oscillation mirror 16. On the other hand, an image formed by projecting the field stop 26 of FIG. 1 on the wafer 4 in parallel with the zero-order light 20 becomes a rectangular detection area 30 of FIG. 4. That is, among the parallel light flux incident on the shot area 28, only the reflected light of light flux incident on the detection area 30 enters the four-division light receiving device 22 of FIG. 1. Thereafter, the inclination of the average plane of the detection area 30 is detected.

The size of the detection area 30 can be determined without depending on the size of the illumination area 27 determined by the field stop 27, the swing angle and direction of the oscillation mirror 16. Therefore, it is possible to easily set an area on the wafer 4 for detecting its inclination by setting the illumination area 27 and the swing range of the oscillation mirror 16 a little larger than required in advance and change the opening of the field stop 26 in accordance with the size of the shot area on the wafer 4. When restricting the size of the detection area 30 by means of the field stop 26, the width of the detection area cannot be judged from the range of the inclination of the oscillation mirror 16. Then, for example, the averaging circuit 19 may monitor the signal of the sum of the detection signals A(t) to D(t) and integrate the detection signals SX(t) and SY(t) from the time when the level of the sum signal exceeds a predetermined threshold to the time when it becomes equal to or less than the threshold.

In FIG. 1, as the zero-order light from the wafer 4 is parallel light flux, it can be said that the surface of the field stop 26 is substantially conjugate to the surface of the wafer 4. In this case, as incident light on the wafer 4 is also the parallel light flux 15, the field stop 26 may be disposed between the objective lens 14 and the wafer 4. Further, after a relay optical system is provided after the condenser lens 21 to provide a plane actually conjugate to the surface of the wafer 4, the field stop 26 may be provided on the conjugate plane.

Figure 5:
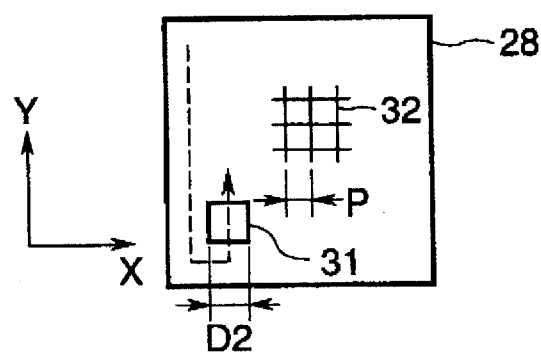
FIG. 5 is an explanatory view showing the method of scanning the wafer with the parallel light flux two-dimensionally.

Next, although the parallel light flux is scanned on the wafer 4 one-dimensionally in the above embodiment, it may be scanned on the wafer 4 two-dimensionally, as shown in FIG. 5.

That is, in FIG. 5, when patterns 32 having pitch P in the X and Y directions are formed in the shot area 28 on the wafer and parallel light flux is incident on the patterns 32 from the −X direction, the quantity of diffracted light produced in the +Y direction is assumed to be largely different from that of diffracted light produced in the −Y direction. In this case, an illumination area 31 of the parallel light flux is determined to be a square whose widths in the X and Y directions are D2, which is set to be equal to or less than twice the pitch P of the patterns 32, or preferably less than the pitch P. Then, by swinging the oscillation mirror 16 in two directions, the whole surface of the shot area 28 is scanned by the illumination area 31 two-dimensionally, as indicated by a dotted line in FIG. 5. Thereafter, the detection signals SX(t) and SY(t) output from the calculating circuit 24 of FIG. 1 are averaged, whereby the average inclination of the shot area 28 can be detected accurately in spite of the presence of the patterns 32.

In the above embodiment, as photoelectric detecting means for detecting the position of the condensed point (the pinhole image) of the parallel light flux, the four-division light receiving device 22 is utilized, but a so-called position sensitive detector (PSD) may be utilized. Also, although the parallel light flux from the pinhole illuminates the wafer 4, parallel light flux from a cross-shaped pattern may illuminate the wafer 4.

Also, instead of scanning the parallel light flux 15 on the wafer 4 by means of the oscillation mirror 16, the oscillation mirror 16 is fixed and the wafer 4 may be scanned by the wafer stage 7 in the X direction. Thus, the present invention is not limited to the above embodiment, and various constructions can be taken without departing from the scope of the present invention.

According to the present invention, a substrate to be measured and parallel light flux are scanned relatively, so that the width of an illumination area of the parallel light flux in a scanning direction can be made narrow with respect to a detection area (shot area) on the substrate for detecting the inclination thereof. Therefore, even though there are periodic patterns in the detection area, the quantity of diffracted light is reduced, so that it is possible to detect the average inclination of the detection area of the substrate by performing a statistical processing (integration) for detection signals from photoelectric detecting device.

Also, when an irradiating optical system has a relay optical system for condensing light flux from a predetermined pattern once and an irradiating objective optical system for transforming the once condensed light flux into parallel light flux, and relative scanning means has a reflecting member disposed on a condensed point of the light flux by means of the relay optical system and drive means for driving the reflecting member to change the incident angle of the condensed light flux with respect to the irradiating objective optical system, the parallel light flux emitted from the irradiating objective optical system is translated by driving the reflecting member. Therefore, since the parallel light flux scans the substrate to be measured at the same incident angle, detection signals from the optical detecting device can be easily processed.

Further, when the parallel light flux from the irradiating optical system to the substrate and the substrate are scanned relatively by means of the relative scanning device along the incident direction of the parallel light flux, the width of the illumination area in the incident direction can be narrowed. Therefore, diffracted light from patterns formed periodically in the incident direction which tends to be dissymmetrical is reduced, so that the inclination of the average plane of the detection area can be detected accurately by performing only one-dimensional scanning.

Next, when a stop (field stop 26) for restricting the detection area on the substrate is provided in the irradiating optical system or the condensing optical system, the detection area can be determined without depending on the size of the illumination area of the parallel light flux on the substrate and the scanning direction thereof, so that the degree of freedom of setting the shape of the detection area can be enhanced. Conversely speaking, it is possible to enhance the degree of freedom of designing the optical system of the inclination detecting apparatus with respect to the specific detection area.

What is claimed is:

1. An inclination detecting apparatus which detects an inclination of a partial area within an area of a substrate relative to a predetermined plane, comprising:

an irradiating optical system which irradiates a portion of the surface of said partial area with parallel light flux obliquely relative to an optical axis;

a condensing optical system which condenses light flux reflected from said substrate;

a photoelectric detecting device which generates a detection signal corresponding to a position of the condensed light flux, said detection signal varying in accordance with an inclination of said portion of said partial area relative to said predetermined plane;

a relative scanning device which relatively moves said parallel light flux and said substrate so that the entire surface of said partial area is scanned with said parallel light flux; and a calculating circuit which obtains an inclination of said partial area relative to said predetermined plane based on detection signals from said photoelectric detecting device that are generated in sequence during the relative movement.

2. An inclination detecting apparatus according to claim 1, wherein said calculating circuit obtains the inclination of said partial area by statistically processing said detection signals that are generated in sequence in accordance with a relative scanning position of said parallel light flux and said substrate.

3. An inclination detecting apparatus according to claim 1, wherein said irradiating optical system has a relay optical system which condenses light flux from a predetermined pattern; and an irradiating objective optical system which transforms the condensed light flux from said predetermined pattern into said parallel light flux, and wherein said relative scanning device has a reflecting member disposed at a point at which said light flux is condensed by said relay optical system; and a drive device which drives said reflecting member to change an incident angle of said light flux condensed by said relay optical system with respect to said irradiating objective optical system.

4. An inclination detecting apparatus according to claim 1, wherein said relative scanning device moves said parallel light flux and said substrate relatively along an axis perpendicular to said optical axis.

5. An inclination detecting apparatus according to claim 1, further comprising a stop which defines a detection area on said substrate which is used in obtaining the inclination of said partial area, said stop being provided in said irradiating optical system or said condensing optical system.

6. An inclination detecting apparatus according to claim 1, wherein said inclination detecting apparatus is provided in a projection exposure apparatus including a projection optical system having an optical axis that corresponds to said optical axis, and said inclination detecting apparatus detects the inclination of said partial area with respect to a plane perpendicular to said optical axis.

7. A method of detecting an inclination of a partial area within an area of a substrate relative to a predetermined plane, comprising the steps of:

irradiating the surface of a portion of said partial area with parallel light flux;

moving said parallel light flux and said substrate relatively so that the entire surface of said partial area is scanned with said parallel light flux; and obtaining an inclination of said partial area relative to said predetermined plane based on information of an inclination relative to said predetermined plane of each of respective plural portions on said partial area irradiated in sequence with said parallel light flux during the relative movement.

8. An apparatus which detects an inclination of a partial area within an area of a substrate relative to a predetermined plane, comprising:

an irradiating optical system which irradiates a portion of said partial area with a light beam;

a photoelectric detecting device which receives corresponding light reflected from said substrate so that a signal corresponding to an inclination of said portion of said partial area relative to said predetermined plane is generated;

a device which relatively moves said partial area and said light beam; and a calculating circuit which obtains an inclination of said partial area relative to said predetermined plane based on signals generated in sequence from said photoelectric detecting device during the relative movement.

9. A method of detecting an inclination of a partial area within an area of a substrate relative to a predetermined plane, comprising the steps of:

irradiating a portion of said partial area on said substrate with a light beam;

obtaining, in response to said irradiating, a detection signal corresponding to an inclination of said portion of said partial area relative to said predetermined plane;

relatively moving said partial area and said light beam; and obtaining an inclination of said partial area, relative to said predetermined plane based on plural detection signals, each corresponding to an obtained signal for a respective portion of said partial area, obtained during the relative movement.

10. An exposure method of transferring a pattern of a mask onto a partial area within a substrate area, comprising the steps of:

irradiating a portion of said partial area with a light beam;

obtaining, in response to said irradiating, a detection signal corresponding to an inclination of said portion of said partial area relative to a predetermined plane;

relatively moving said partial area and said light beam; and obtaining an inclination of said partial area relative to said predetermined plane based on plural detection signals, each corresponding to an obtained signal for a respective portion of said partial area, obtained during the relative movement.

11. An exposure method according to claim 10, wherein said inclination of said partial areas is regarded as the inclination of the substrate.

* * * * *